(12) United States Patent
Lahood et al.

(10) Patent No.: US 9,161,485 B2
(45) Date of Patent: Oct. 13, 2015

(54) SYSTEM AND METHOD FOR MICROELECTRONICS LAMINATION PRESS

(71) Applicant: BAE Systems Information and Electronic Systems Integration Inc., Nashua, NH (US)

(72) Inventors: John W. Lahood, N. Andover, MA (US); Edward M. Hardy, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 137 days.

(21) Appl. No.: 14/100,643

(22) Filed: Dec. 9, 2013

(65) Prior Publication Data

US 2014/0096907 A1    Apr. 10, 2014

Related U.S. Application Data

(62) Division of application No. 12/427,317, filed on Apr. 21, 2009, now Pat. No. 8,627,867.

(51) Int. Cl.
| B32B 37/00 | (2006.01) |
| H05K 13/00 | (2006.01) |
| B32B 37/10 | (2006.01) |

(52) U.S. Cl.
CPC ............ *H05K 13/00* (2013.01); *B32B 37/0046* (2013.01); *B32B 37/10* (2013.01); *B32B 2309/02* (2013.01); *B32B 2309/12* (2013.01); *B32B 2457/00* (2013.01)

(58) Field of Classification Search
CPC ..... B32B 37/0046; B32B 37/10; H05K 13/00
USPC ........... 156/64, 228, 358, 359, 366, 580, 581, 156/583.1, 583.3, 583.4
See application file for complete search history.

(56) References Cited

U.S. PATENT DOCUMENTS

| 5,635,014 A | 6/1997 | Taylor |
| 6,755,936 B2 | 6/2004 | Eile et al. |
| 2009/0032570 A1* | 2/2009 | Matsumura ................ 228/123.1 |

* cited by examiner

*Primary Examiner* — James Sells
(74) *Attorney, Agent, or Firm* — Daniel J. Long; Hayes Soloway PC; Todd A. Sullivan

(57) ABSTRACT

The system contains a lamination press. The first cavity is formed in a chassis. A film assembly is fitted within the chassis. A buffer mounts over the film assembly and within the chassis. A tool set is shaped to fit within the first cavity. The tool set and chassis are positioned within the lamination press to confer heat and pressure from the lamination press to the film assembly and chassis.

14 Claims, 5 Drawing Sheets

SYSTEM AND METHOD FOR MICROELECTRONICS LAMINATION PRESS

CROSS-REFERENCE TO RELATED APPLICATIONS

This Application is a divisional of U.S. application Ser. No. 12/427,817 filed Apr. 21, 2009, U.S. Pat. No. 8,627,867 the contents of which are incorporated herein by reference.

STATEMENT REGARDING FEDERALLY SPONSORED RESEARCH OR DEVELOPMENT

This disclosure was made in part with Government support under contract number FA8611-06-C-2899. The Government has certain rights in the disclosure.

FIELD

The present disclosure is generally related to laminating a film assembly into an electronic device, and more particularly is related to laminating a film assembly within a cavity of a substrate.

BACKGROUND

The manufacture of some electronic devices, including some utilizing radio frequencies, requires the use of electrically conductive film epoxies. These epoxies are used to bond substrates (of various materials) to aluminum chassis that sometimes have milled channels as deep as one inch. The purpose of the channels is to provide a predetermined space for which the radio frequency energy travels. However, laminating substrates in these deep and often intricate channels presents a processing challenge The lamination process must be capable of providing enough heat and pressure to achieve a reliable bond line.

In the past, lamination has been performed with a vacuum equipped oven capable of providing pressure to the components while subjected to appropriate cure temperatures (up to 150 celsius). Although, vacuum offers a consistent means of applying pressure, the pressure is limited. An ideal vacuum will provide approximately 14.7 psi. However, in practice, there is loss and this particular vacuum process provided no greater than 11 psi of pressure. This pressure is insufficient for curing many microelectronic film epoxies. Because of insufficient pressures using the vacuum method, substrates would not bond consistently and often times delaminated or even peeled away from the chassis floor. The immediate effect is a detriment to the radio frequency performance and the longer term implication is a compromise product reliability.

Lamination presses are used throughout the industry for a variety of applications. The platens are typically flat plates used for applying pressure to flat materials. They are not typically used for bonding microelectronic substrates into deep chassis cavities.

Thus, a heretofore unaddressed need exists in the industry to address the aforementioned deficiencies and inadequacies.

SUMMARY

Embodiments of the present disclosure provide a system and method for laminating an electronic device having a first cavity. Briefly described, in architecture, one embodiment of the system, among others, can be implemented as follows. The system contains a lamination press. The first cavity is formed in a chassis. A film assembly is fitted within the chassis. A buffer mounts over the film assembly and within the chassis. A tool set is shaped to fit within the first cavity. The tool set and chassis are positioned within the lamination press to confer heat and pressure from the lamination press to the film assembly and chassis.

The present disclosure can also be viewed as providing methods for laminating an electronic device having a first cavity. In this regard, one embodiment of such a method, among others, can be broadly summarized by the following steps: tacking a conductive film to a substrate, forming a film assembly; positioning a film assembly within a chassis having the first cavity; at least partially filling the chassis with a buffer; and applying a pressure and heat to the film assembly and the chassis.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale. Instead emphasis is being placed upon illustrating clearly the principles of the present disclosure. Moreover, in the drawings, like reference numerals designate corresponding parts throughout the several views.

DETAILED DESCRIPTION

Figure 1:
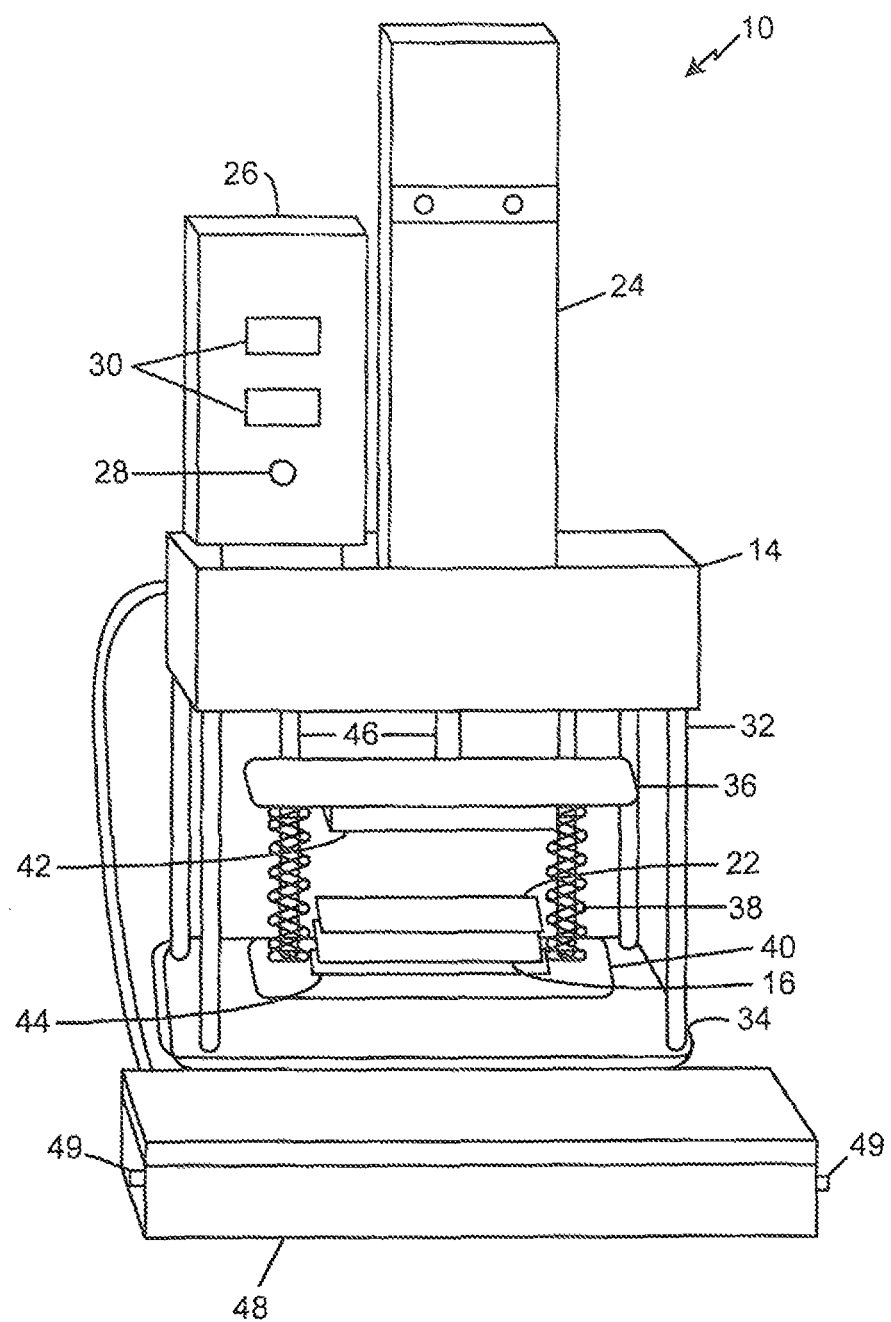
FIG. 1 is an illustration of a prospective view of a system for laminating an electronic device having a first cavity, in accordance with a first exemplary embodiment of the present disclosure.

FIG. 1 is an illustration of a prospective view of a system 10 for laminating an electronic device having a first cavity 12 (shown in FIG. 2A), in accordance with a first exemplary embodiment of the present disclosure. The system contains a lamination press 14. The first cavity 12 is formed in a chassis 16. A film assembly 18 (shown in FIG. 3) is fitted within the chassis 16. A buffer 20 (shown in FIG. 3) mounts over the film assembly 18 and within the chassis 16. A tool set 22 is shaped to engage the chassis 16 and to fit within the first cavity 12. The tool set 22 and chassis 16 are positioned within the lamination press 14 to confer heat and pressure from the lamination press 14 to the film assembly 18 and chassis 16.

The lamination press 14 is shown in FIG. 1. The lamination press 14 is driven by a pneumatic system 24 that may be capable of providing 0-50 PSI of pressure to the film assembly 18 and chassis 16. The lamination press 14 may be able to provide between 20 and 30 PSI of pressure to the film assembly 18 and chassis 16. The lamination press 14 includes a control mechanism 26 for controlling the temperature, pressure, and duration of the operation of the lamination press 14. The control of mechanism 26 may include a plurality of presets for storing a preferred temperature, pressure, and duration for multiple operations of the lamination press 14. The control mechanism 26 may comprise hardware controls, software controls, or a combination thereof, and may be controlled through input switches 28 and output displays 30 and/or a connection to a computer terminal.

The lamination press 14 sits on four posts 32 and a base 34, although variations in this part of the lamination press 14 design may be known to those having ordinary skill in the art. The pneumatic system 24 is in mechanical communication with a top plate 36, through at least one ram 46, which can be forced down with controlled pressure when the pneumatic system 24 is activated. The top plate 36 sits on two springs 38, or other biasing mechanisms, separating the top plate 36 from a bottom plate 40. Mounted to the top plate 36 is an upper platen 42. Mounted to the bottom plate 40 is a lower platen 44. The platens 42, 44 may heat the chassis 16 and tool set 22 when placed between the platens 42, 44. Initiation of the lamination press 14 may be controlled by a switch box 48 with a pair of activation switches 49 on opposing ends of the switch box 48 that require two hands to initiate, thereby avoiding inadvertent initiation. The activation switches 49 may be located at least approximately eight inches apart.

Figure 2A:
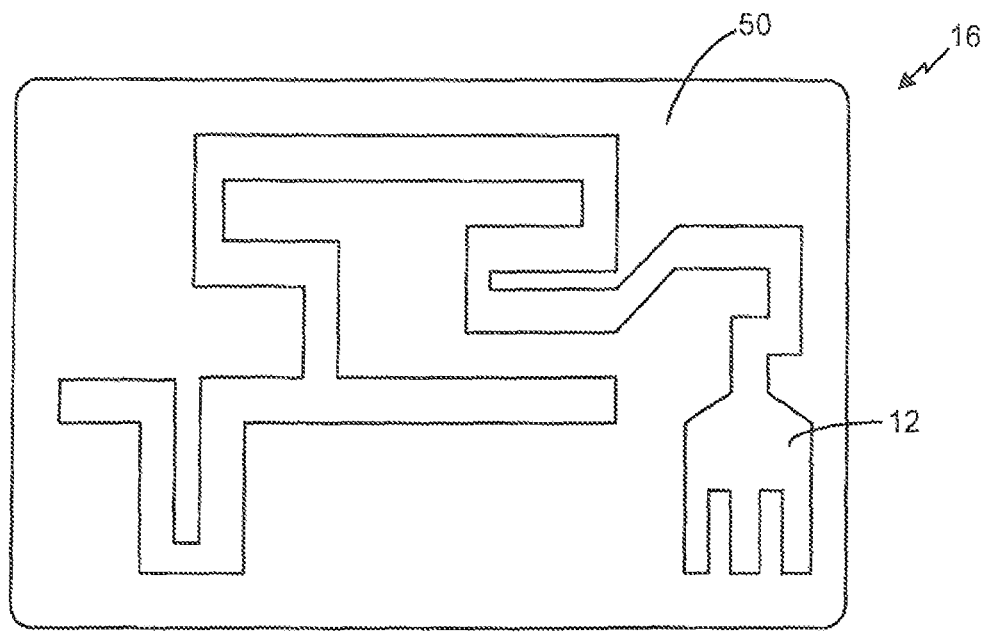
FIG. 2A is an illustration of a top view of a chassis used with the system illustrated in FIG. 1, in accordance with the first exemplary embodiment of the present disclosure.

FIG. 2A is an illustration of a top view of a chassis 16 used with the system 10 illustrated in FIG. 1, in accordance with the first exemplary embodiment of the present disclosure. The chassis 16 may be a base for a radio frequency electronic device. The chassis 16 may be made of aluminum or other metals, which exhibit properties useful for transmission of RF signals. The chassis 16 includes a first cavity 12 on a first face 50. The first cavity 12 may be formed with a uniform depth in the chassis 16 or it may have a varying depth. The depth of the first cavity 12 may be at least one eighth of an inch and as deep as an inch. The depth of the first cavity 12 may be at least a half inch in some regions and shallower in other regions.

Figure 2B:
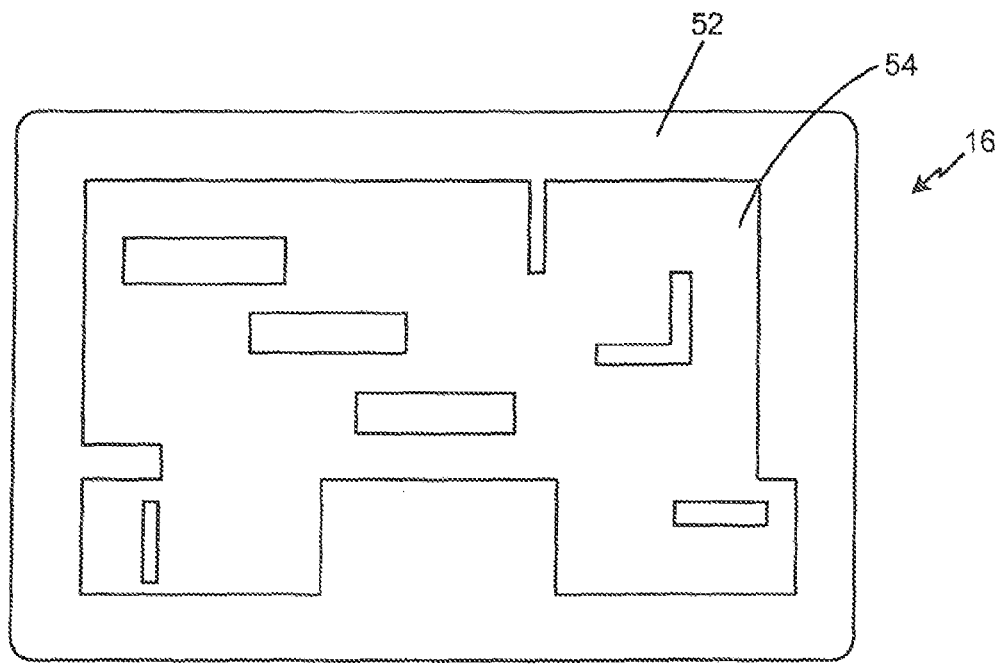
FIG. 2B is an illustration of a bottom view of the chassis of FIG. 2A, in accordance with the first exemplary embodiment of the present disclosure.

FIG. 2B is an illustration of a bottom view of the chassis 16 of FIG. 2A, in accordance with the first exemplary embodiment of the present disclosure. The bottom view illustrates a second face 52 of the chassis 16. The second face 52 may be flat or, as shown in FIG. 2B, the second face 52 may contain a feature. In the embodiment shown in FIG. 2B, the feature is a second cavity 54. The second cavity 54 may receive a second film assembly (not shown and not materially distinguishable from the film assembly 8). The cavities 12, 54 may take the form of extending channels, as in FIG. 2A, sunken regions encompassing raised elements, as in FIG. 2B, or any other desirable cavity formation.

Figure 3:
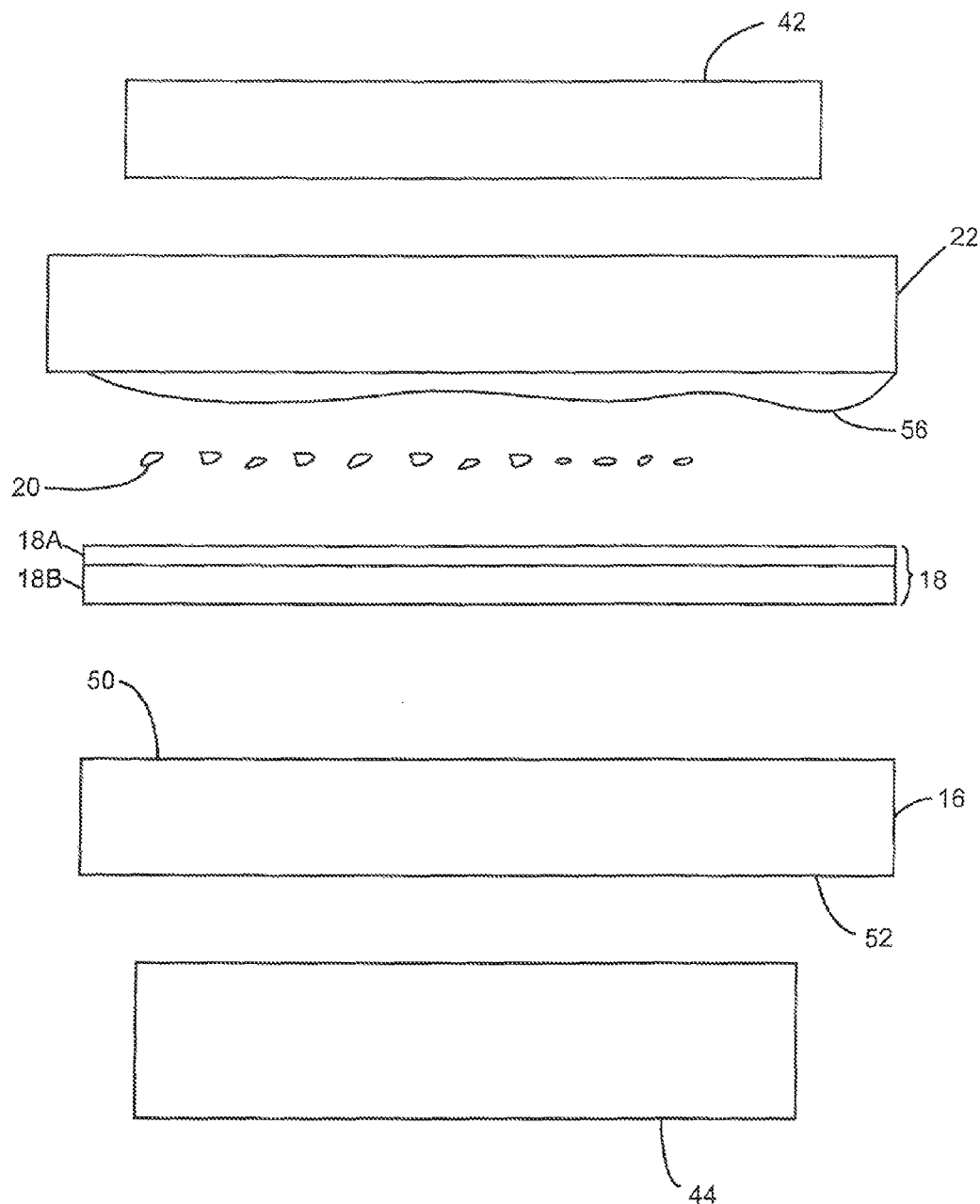
FIG. 3 is an illustration of an exploded view of elements of the system that are inserted between the platens shown in FIG. 1, in accordance with the first exemplary embodiment of the present disclosure.

FIG. 3 is an illustration of an exploded view of elements of the system 10 that are inserted between the platens 42, 44 shown in FIG. 1, in accordance with the first exemplary embodiment of the present disclosure. The chassis 16 may sit on the lower platen 44 with the first face 50 facing upward. The film assembly 18 may sit within the first cavity 12 (shown in FIG. 2B). The film assembly 18 may be shaped to conform to a shape of the first cavity 12. The buffer 20 may be placed within the cavity 12 on top of the film assembly 18. The tool set 22 rests on the buffer 20 and may be pressed upon by the upper platen 42. The tool set 22 includes at least one protrusion 56. The protrusion 56 may be shaped to conform to the first cavity 12 such that the protrusion 56 enters the cavity 12, applying pressure to the buffer 20, which applies pressure to the film assembly 18. The buffer 20 may be, for example, rubber pellets or a rubber sheet that may uniformly apply pressure to the film assembly 18 without significant risk of damaging the film assembly 18. The tool set 22 may be adequately thermally conductive to transmit at least a portion of the heat from the upper platen 42 to the chassis 16 and film assembly 18.

If a second film assembly is to be applied to the second cavity 54 (shown in FIG. 2B) in the second face 52, the chassis 16 may be flipped over and a similar collection of elements may be used to laminate the second film assembly to the second cavity 54. In this instance, a second tool set may be required that has protrusions conforming at least in part to the second cavity 54. Alternatively, the film assembly 18 and the second film assembly may be laminated concurrently with the film assemblies 18 sitting with buffer 20 in the cavities 12, 54 sandwiched by two tool sets 22. The lamination press 16 may confer a temperature of at least one hundred degrees Celsius and at least 12 PSI to the film assembly 18 and chassis 16. The film assembly 18 may include a conductive film 18A tacked to a duroid substrate 18B. Another material, other than duroid, may be used for the substrate 18B without materially altering the system or process of manufacture.

Figure 4:
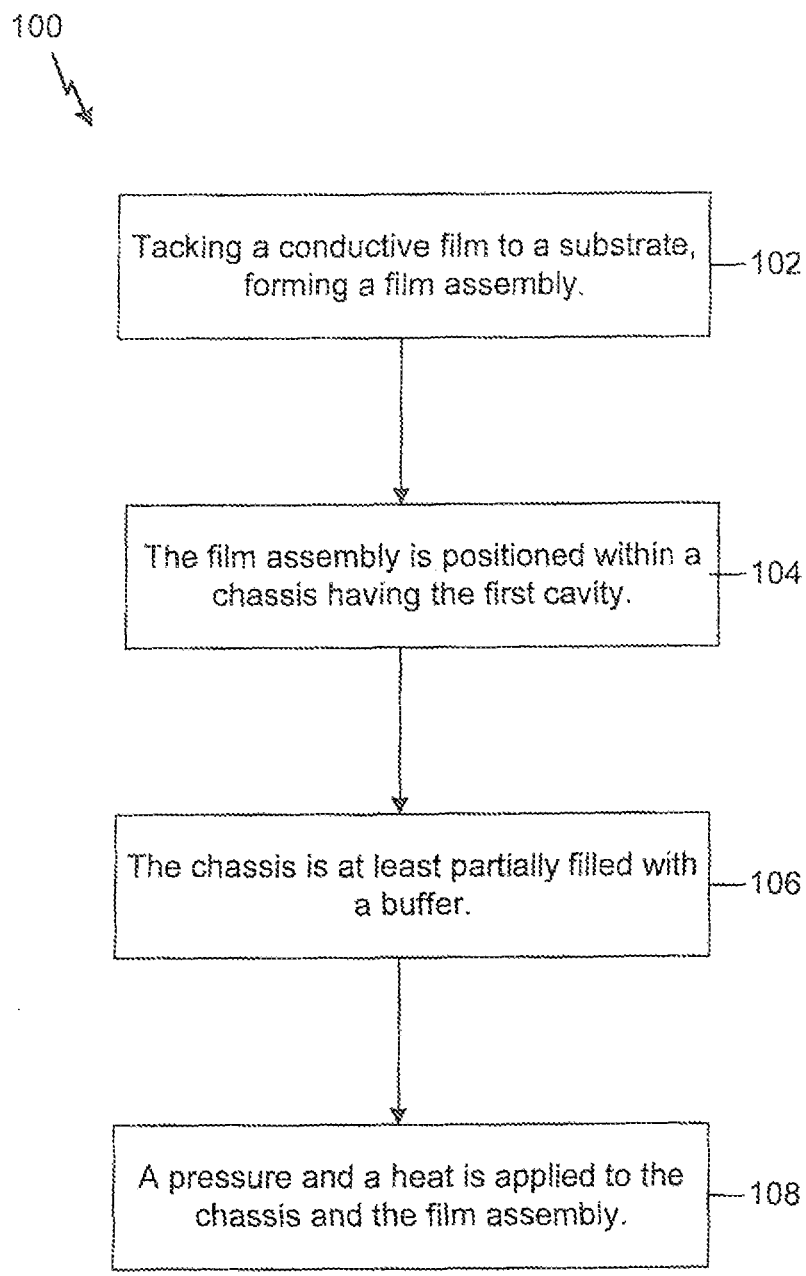
FIG. 4 is an illustration of a flowchart illustrating a method for laminating an electronic device having a first cavity using the system of FIG. 1, in accordance with the first exemplary embodiment of the present disclosure.

FIG. 4 is an illustration of a flowchart 100 illustrating a method for laminating an electronic device having a first cavity 12 using the system 10 of FIG. 1, in accordance with the first exemplary embodiment of the present disclosure. It should be noted that any process descriptions or blocks in flow charts should be understood as representing modules, segments, portions of code, or steps that include one or snore instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 102, tacking a conductive film to a substrate, forming a film assembly 18. The film assembly 18 is positioned within a chassis 16 having the first cavity 12 (block 104). The chassis 16 is at least partially filled with a buffer 20 (block 106). A pressure and a heat is applied to the chassis 16 and the film assembly 18 (block 108).

Figure 5:
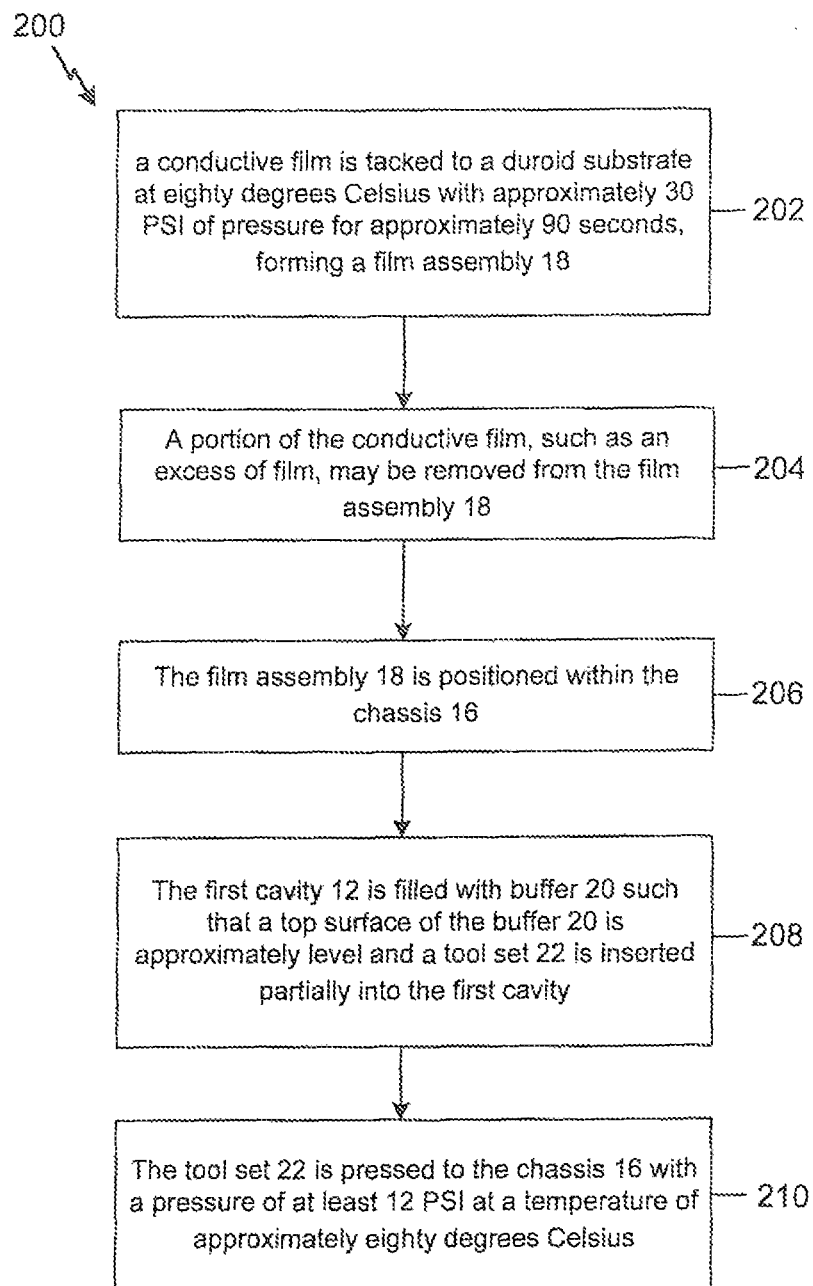
FIG. 5 is an illustration of a flowchart illustrating a method for laminating an electronic device having a first cavity using the system FIG. 1, in accordance with a second exemplary embodiment of the present disclosure.

FIG. 5 is an illustration of a flowchart 200 illustrating a method for laminating an electronic device having a first cavity 12 using the system 10 of FIG. 1 in accordance with a second exemplary embodiment of the present disclosure. First, a conductive film is tacked to a duroid substrate at eighty degrees Celsius with approximately 30 PSI of pressure for approximately 90 seconds, forming a film assembly 18 (block 202). A portion of the conductive film, such as an excess of film, may be removed from the film assembly 18 (block 204). The film assembly 18 is positioned within the chassis 16 (block 206). The first cavity 12 is filled with buffer 20 such that a top surface of the buffer 20 is approximately level and a tool set 22 is inserted partially into the first cavity 12 (block 208). The tool set 22 is pressed to the chassis 16 with a pressure of at least 12 PSI at a temperature of approximately eighty degrees Celsius (block 210).

The pressure and heat may be applied for 20-70 minutes. The heat may range from 100 to 200 degrees Celsius and, more precisely, from 125 to 175 degrees Celsius. The pressure may range from 20-30 PSI and 25 PSI has shown to be effective, although other pressures are certainly available based on the present disclosure.

The electronic device may be laminated with a plurality of film assemblies in the first cavity 12.

It should be emphasized that the above-described embodiments of the present disclosure, particularly, any "preferred" embodiments, are merely possible examples of implementations, merely set forth for a clear understanding of the principles of the disclosed system and method. Many variations and modifications may be made to the above-described embodiments of the disclosure without departing substantially from the spirit and principles of the disclosure. All such modifications and variations are intended to be included herein within the scope of this disclosure and protected by the following claims.

What is claimed is:

1. A method for laminating an electronic device having a first cavity, the method comprising the steps of:
    tacking a conductive film to a substrate, forming a film assembly;
    positioning the film assembly within a chassis having the first cavity;
    at least partially filling the chassis with a buffer, wherein the buffer further comprises rubber pellets and the method further comprises the step of leveling out the plurality of rubber pellets; and
    applying a pressure and heat to the film assembly and the chassis.

2. The method of claim 1, further comprising the step of positioning at least one additional ceramic substrate in the chassis with the film assembly.

3. The method of claim 1, wherein the chassis further comprises first and second opposing faces and wherein the first opposing face comprises the first cavity and the second opposing face comprises a second cavity.

4. The method of claim 1, wherein the step of tacking the conductive film to the substrate further comprises the step of applying at least 12 PSI of pressure and at least sixty degrees Celsius heat to the conductive film and the substrate.

5. The method of claim 1, further comprising the step of programming a lamination press to apply the pressure for at least ten minutes.

6. The method of claim 5, further comprising using two initiation switches separated by at least eight inches to initiate the lamination press.

7. The method of claim 1, wherein the step of applying the pressure further comprises applying the pressure using a tool set having a protrusion shaped similarly to the first cavity, thereby allowing the tool set to engage the first cavity.

8. The method of claim 1, wherein applying the pressure and heat to the film assembly and the chassis further comprises using the plurality of rubber pellets to uniformly apply pressure to the film assembly and the chassis.

9. A method for laminating an electronic device having a first cavity, the method comprising the steps of:
    tacking a conductive film to a substrate, forming a film assembly;
    positioning the film assembly within a chassis having the first cavity;
    at least partially filling the chassis with a buffer, wherein the buffer further comprises a plurality of pellets; and
    applying a pressure and heat to the film assembly and the chassis.

10. The method of claim 9, wherein the plurality of pellets further comprises a plurality of leveled pellets.

11. The method of claim 9, wherein the plurality of pellets further comprises a plurality of rubber pellets.

12. The method of claim 9, wherein applying the pressure and heat to the film assembly and the chassis further comprises using the plurality of pellets to uniformly apply pressure to the film assembly and the chassis.

13. A method for laminating an electronic device having a first cavity, the method comprising the steps of:
    tacking a conductive film to a substrate, forming a film assembly;
    positioning the film assembly within a chassis having the first cavity;
    at least partially filling the chassis with a pelletized buffer; and
    applying a pressure and heat to the film assembly and the chassis.

14. The method of claim 13, wherein applying the pressure and heat to the film assembly and the chassis further comprises using the pelletized buffer to uniformly apply pressure to the film assembly and the chassis.

* * * * *